US012332824B2

(12) United States Patent
Loh et al.

(10) Patent No.: US 12,332,824 B2
(45) Date of Patent: Jun. 17, 2025

(54) BACKSIDE INTERFACE FOR CHIPLET ARCHITECTURE MIXING (71) Applicant: Advanced Micro Devices, Inc., Santa Clara, CA (US)

(72) Inventors: Gabriel Hsiuwei Loh, Bellevue, WA (US); Todd David Basso, Boxborough, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 51 days.

(21) Appl. No.: 18/090,254

(22) Filed: Dec. 28, 2022

(65) Prior Publication Data

US 2024/0220438 A1 Jul. 4, 2024

(51) Int. Cl.
G06F 13/40 (2006.01)
G06F 1/08 (2006.01)
H01L 23/538 (2006.01)
H01L 25/065 (2023.01)

(52) U.S. Cl.
CPC ............ *G06F 13/4068* (2013.01); *G06F 1/08* (2013.01); *H01L 23/538* (2013.01); *H01L 25/0655* (2013.01)

(58) Field of Classification Search
CPC ..... G06F 13/4068; G06F 1/08; H01L 23/538; H01L 25/0655
See application file for complete search history.

(56) References Cited

U.S. PATENT DOCUMENTS

| | | | |
|---|---|---|---|
| 2020/0105718 A1 | 4/2020 | Collins | |
| 2020/0194262 A1 | 6/2020 | Delacruz | |
| 2020/0373235 A1* | 11/2020 | Collins | ................ H01L 23/481 |
| 2021/0097013 A1* | 4/2021 | Saleh | ................ G06F 12/0837 |
| 2021/0183776 A1 | 6/2021 | Cheah | |
| 2021/0344618 A1* | 11/2021 | Zheng | ................ H04L 41/0813 |
| 2022/0036500 A1* | 2/2022 | Matam | ................ G06F 13/4068 |
| 2022/0052023 A1 | 2/2022 | Fu | |
| 2022/0070115 A1* | 3/2022 | Brewer | ................ H04L 49/109 |
| 2022/0222198 A1 | 7/2022 | Lanka | |
| 2023/0124949 A1* | 4/2023 | Salazar | ................ G06F 1/325 |
| | | | 323/267 |

OTHER PUBLICATIONS

International Search Report and Written Opinion mailed Apr. 29, 2024, from corresponding International Application No. PCT/US2023/086036 (9 pages).

* cited by examiner

Primary Examiner — Henry Tsai
Assistant Examiner — Harry Z Wang
(74) Attorney, Agent, or Firm — Greenberg Traurig, LLP (57) ABSTRACT The disclosed semiconductor package includes a first chiplet area for receiving a first chiplet, a second chiplet area for receiving a second chiplet, and a host die coupled to the first and second chiplet areas. The semiconductor package also includes an interconnect directly coupling the first chiplet area to the second chiplet area. Various other methods, systems, and computer-readable media are also disclosed.

20 Claims, 8 Drawing Sheets

BACKSIDE INTERFACE FOR CHIPLET ARCHITECTURE MIXING

BACKGROUND

Silicon chip manufacturing often becomes more expensive non-linearly as chip size increases. For instance, fabricating larger chips have a lower yield as manufacturing defects would require discarding the larger chips. Thus, larger chips can be redesigned into multiple smaller chips (e.g., chiplets) to improve yield and manufacturing costs. Chiplets often interface with a host die for coordinating communication between the chiplets themselves as well as other components off die.

BRIEF DESCRIPTION OF THE DRAWINGS

The accompanying drawings illustrate a number of exemplary implementations and are a part of the specification. Together with the following description, these drawings demonstrate and explain various principles of the present disclosure.

Throughout the drawings, identical reference characters and descriptions indicate similar, but not necessarily identical, elements. While the exemplary implementations described herein are susceptible to various modifications and alternative forms, specific implementations have been shown by way of example in the drawings and will be described in detail herein. However, the exemplary implementations described herein are not intended to be limited to the particular forms disclosed. Rather, the present disclosure covers all modifications, equivalents, and alternatives falling within the scope of the appended claims.

DETAILED DESCRIPTION

The present disclosure is generally directed to backside interfaces for chiplet architecture mixing. As will be explained in greater detail below, implementations of the present disclosure include at least a first and second chiplet area for receiving chiplets, and a host die having an interface with each of the first and second chiplet areas to allow connecting to chiplets received in the first and second chiplet areas. Implementations of the present disclosure further include an interconnect that directly couples the first chiplet area to the second chiplet area to allow a direct connection between the chiplets received in the first and second chiplet areas.

As will be described in greater detail below, the instant disclosure describes various systems and methods for chiplet architecture mixing using backside interfaces. The backside interfaces allow bypassing a host die for direct connections between chiplets.

In one implementation, a semiconductor package for chiplet architecture mixing includes a first chiplet area for receiving a first chiplet, a second chiplet area for receiving a second chiplet, a host die coupled to the first and second chiplet areas, and an interconnect directly coupling the first chiplet area to the second chiplet area.

In some examples, semiconductor package further includes a first chiplet in the first chiplet area and a second chiplet in the second chiplet area. In some examples, the first chiplet communicates with the host die using a first communication protocol and the first chiplet communicates with the second chiplet using a second communication protocol via the interconnect. In some examples, the first and second communication protocols run at different clock speeds. In some examples, the second chiplet includes a circuit for disabling the interconnect. In some examples, the circuit includes a ground.

In one implementation, a device for chiplet architecture mixing includes a host die, a plurality of chiplets positioned around the host die and each coupled to the host die, and an interconnect directly coupling a first chiplet of the plurality of chiplets to a second chiplet of the plurality of chiplets.

In some examples, the plurality of chiplets communicate with the host die using a first communication protocol and the first chiplet communicates with the second chiplet using a second communication protocol via the interconnect. In some examples, the first and second communication protocols run at different clock speeds.

In some examples, the second chiplet comprises a circuit for disabling the interconnect. In some examples, the device further includes a passive device and a second interconnect directly coupling the passive device to one of the plurality of chiplets. In some examples, the passive device is not coupled to the host die.

In some examples, the first chiplet is adjacent to the second chiplet. In some examples, the first chiplet is non-adjacent to the second chiplet.

In one implementation, a system for chiplet architecture mixing includes a host die and a plurality of chiplets positioned around the host die and each coupled to the host die through an interconnect interface. Each of the plurality of chiplets communicate with the host die using a first communication protocol via the interconnect interface. The system also includes an interconnect directly coupling a first chiplet of the plurality of chiplets to a second chiplet of the plurality of chiplets. The first chiplet communicates with the second chiplet using a second communication protocol via the interconnect.

In some examples, the first and second communication protocols run at different clock speeds. In some examples, the second chiplet includes a circuit for disabling the interconnect. In some examples, the circuit includes a ground. In some examples, the system further includes a passive device and a second interconnect directly coupling the passive device to one of the plurality of chiplets. In some examples, the passive device is not coupled to the host die.

In some examples, the first chiplet is adjacent to the second chiplet. In some examples, the first chiplet is non-adjacent to the second chiplet.

Features from any of the implementations described herein can be used in combination with one another in accordance with the general principles described herein. These and other implementations, features, and advantages will be more fully understood upon reading the following detailed description in conjunction with the accompanying drawings and claims.

The following will provide, with reference to FIGS. 1-4, detailed descriptions of interfaces and layouts for chiplet architecture mixing. Detailed descriptions of example systems for chiplet architecture mixing are provided in connection with FIGS. 1 and 2. Detailed descriptions of example layouts and corresponding interfaces are provided in connection with FIGS. 3A-3J. Detailed descriptions of an example backside interface is provided in connection with FIG. 4.

Figure 1:
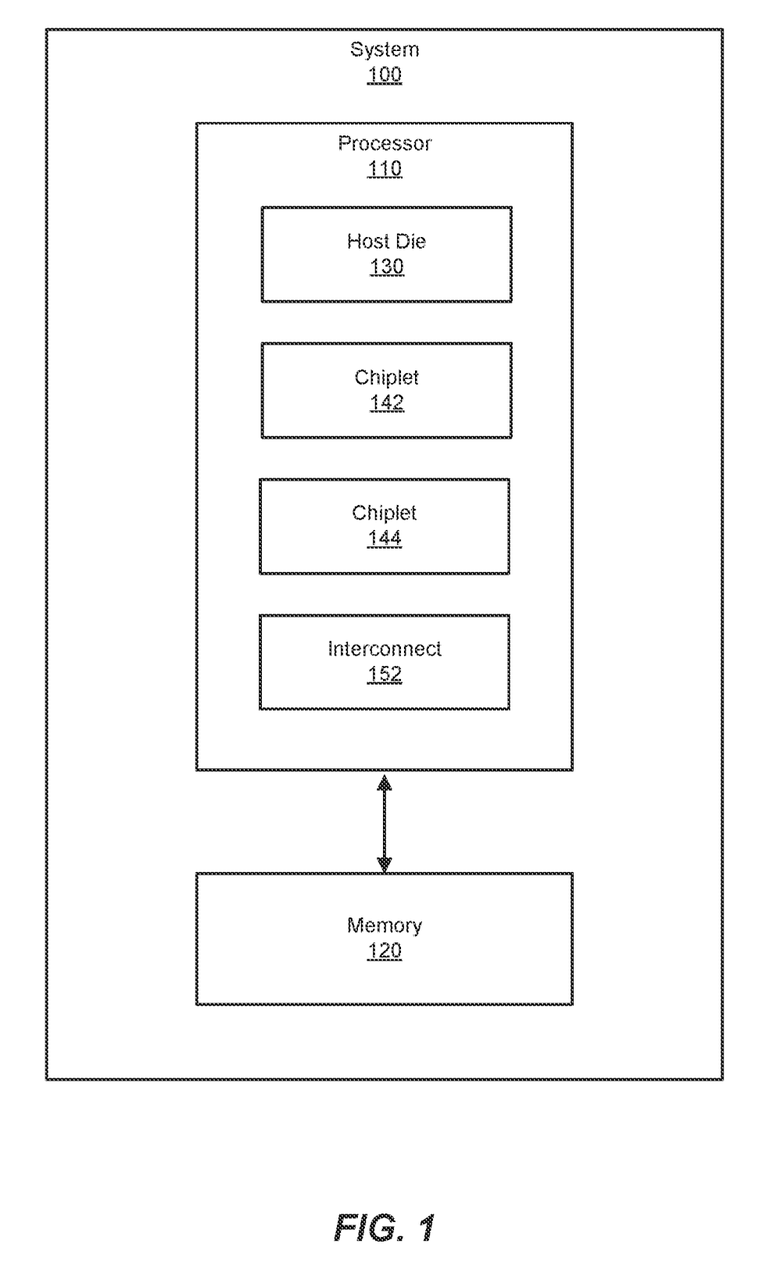
FIG. 1 is a block diagram of an exemplary system for a backside interface for chiplet architecture mixing.

FIG. 1 is a block diagram of an example system 100 for a chiplet architecture. System 100 corresponds to a computing device, such as a desktop computer, a laptop computer, a server, a tablet device, a mobile device, a smartphone, a wearable device, an augmented reality device, a virtual reality device, a network device, and/or an electronic device. As illustrated in FIG. 1, system 100 includes one or more memory devices, such as memory 120. Memory 120 generally represents any type or form of volatile or non-volatile storage device or medium capable of storing data and/or computer-readable instructions. Examples of memory 120 include, without limitation, Random Access Memory (RAM), Read Only Memory (ROM), flash memory, Hard Disk Drives (HDDs), Solid-State Drives (SSDs), optical disk drives, caches, variations or combinations of one or more of the same, and/or any other suitable storage memory.

As illustrated in FIG. 1, example system 100 includes one or more physical processors, such as processor 110. Processor 110 generally represents any type or form of hardware-implemented processing unit capable of interpreting and/or executing computer-readable instructions. In some examples, processor 110 accesses and/or modifies data and/or instructions stored in memory 120. Examples of processor 110 include, without limitation, microprocessors, microcontrollers, Central Processing Units (CPUs), graphics processing units (GPUs), Field-Programmable Gate Arrays (FPGAs) that implement softcore processors, Application-Specific Integrated Circuits (ASICs), systems on chip (SoCs), digital signal processors (DSPs), Neural Network Engines (NNEs), accelerators, graphics processing units (GPUs), portions of one or more of the same, variations or combinations of one or more of the same, and/or any other suitable physical processor.

As further illustrated in FIG. 1, processor 110 includes a host die 130, a chiplet 142, a chiplet 144, and an interconnect 152. Host die 130 corresponds to a host die, such as an input/output die (IOD) or other central die for coordinating input and output for various chiplets such as chiplet 142 and chiplet 144. For example, host die 130 has separate connections to each of chiplet 142 and chiplet 144. Chiplet 142 and chiplet 144 are each chiplets (e.g., small integrated circuits designed for a particular functionality or subset of a functionality that can work together as a single larger integrated circuit). Although chiplet 142 and chiplet 144 can be same or similarly designed chiplets, in other examples chiplet 142 and chiplet 144 can be different designs. Chiplet 142 and chiplet 144 can work together to increase performance, for instance by communicating through host die 130. Accordingly, host die 130 utilizes a standard interface and standard communication protocol to be compatible with various chiplets such that chiplet 142 and chiplet 144 can communicate to each other using the standard communication protocol as relayed through host die 130.

Figure 2:
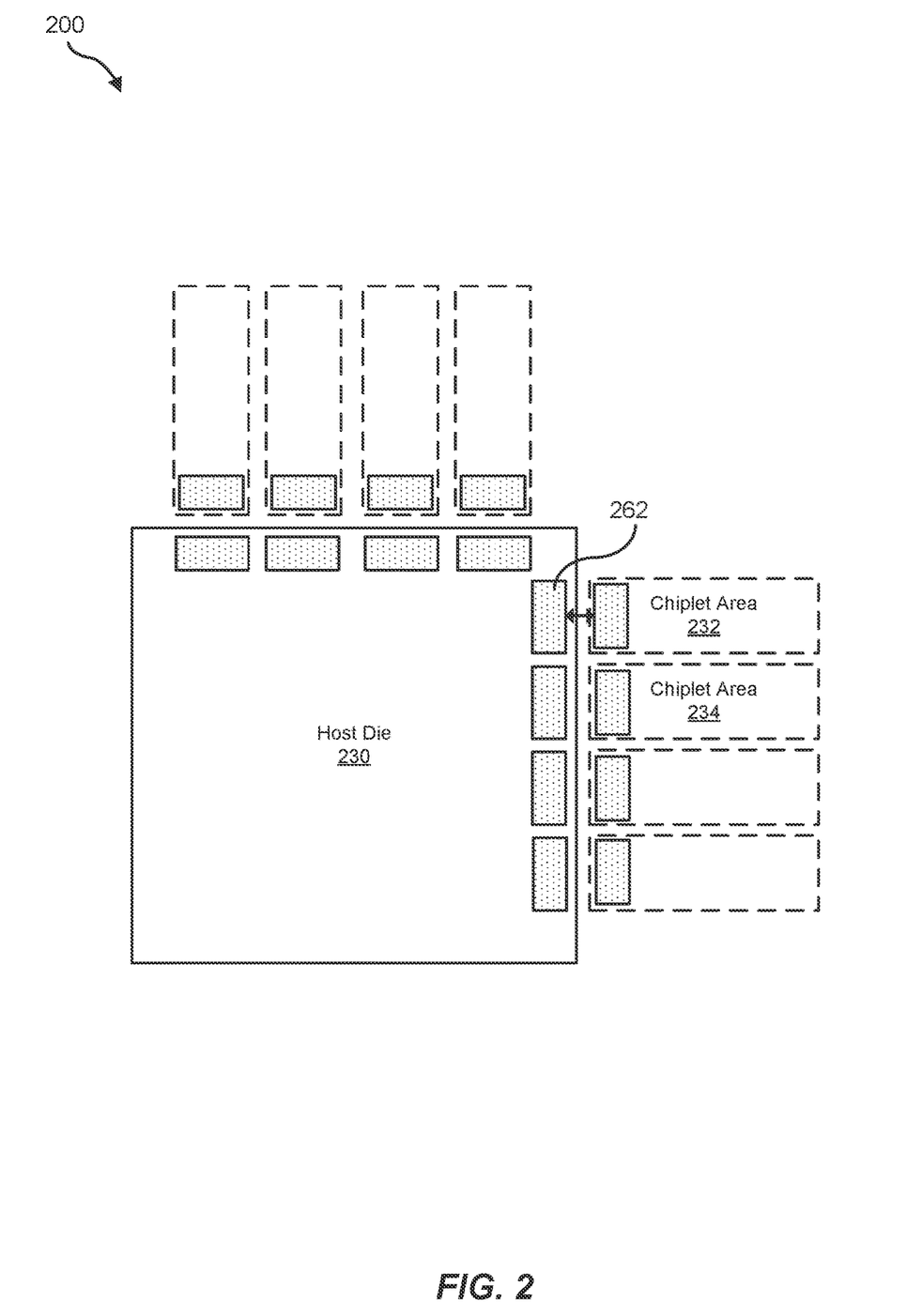
FIG. 2 is a simplified diagram of layout of chiplet areas around a host die.

FIG. 2 illustrates a simplified example layout of a semiconductor package 200 which corresponds to system 100 and/or processor 110. Semiconductor package 200 includes a host die 230 which corresponds to host die 130, a chiplet area 232, a chiplet area 234, and an interface 262. Chiplet area 232 and chiplet area 234 are chiplet areas or landing sites for receiving chiplets such as chiplet 142 and/or chiplet 144. For instance, chiplet 142 can be placed in chiplet area 232, and chiplet 144 can be placed in chiplet area 234. Each chiplet area further includes interface 262 coupled to host die 230. Interface 262, which in some examples is a die-to-die (D2D) interface or other interconnect interface, includes connection points for coupling to host die 230, e.g., vie metal wires and contacts, etc.

As described herein, host die 230 interfaces with and coordinates communication for various chiplets. As such, the chiplet areas, such as chiplet area 232 and chiplet area 234 are arranged or otherwise positioned around host die 230. Additionally, although FIG. 2 shows chiplet areas around two sides of host die 230, in other examples the chiplet areas can be around additional or fewer sides. In some examples, the chiplet areas are arranged adjacent to host die 230 to reduce a length of interface 262 and improve latency. However, as shown in FIG. 2, the chiplet areas only include interfaces to host die 230 such that communication between chiplets must be routed through host die 230. In some examples, inter-chiplet communication does not require communication off-chip such that host die 230 can be a bottleneck in power, latency, etc. for inter-chiplet communication. Moreover, inter-chiplet communication through host die 230 requires sending/receiving signals using a standard communication protocol that is compatible with host die 230. For example, a first chiplet in chiplet area 232 and a second chiplet in chiplet area 234 must convert data and/or signals into the standard communication protocol for sending through host die 230.

Figure 3A:
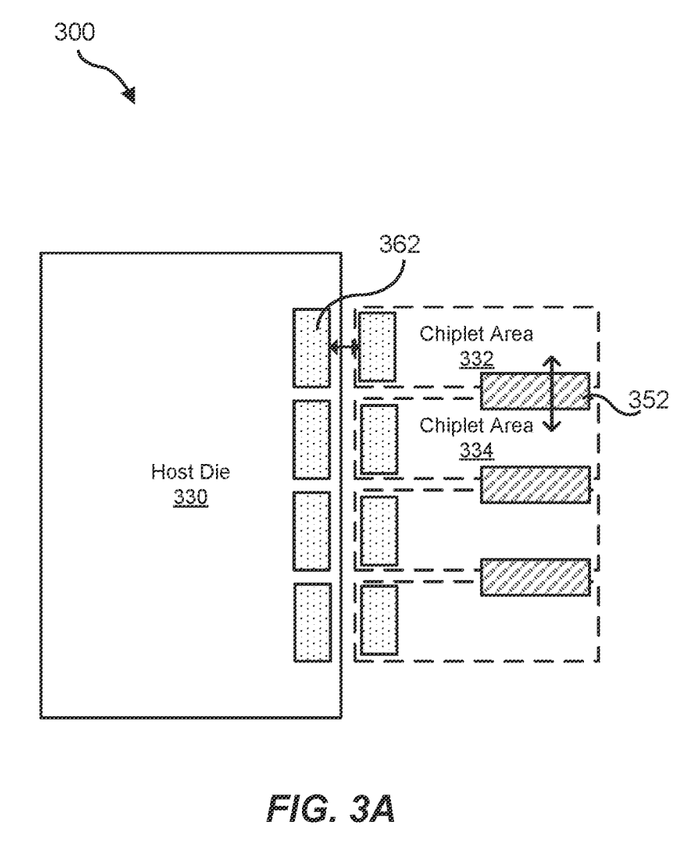
FIGS. 3A-3J are simplified diagrams of example chiplet architectures using backside interfaces.

FIGS. 3A-3J illustrate various example chiplet architectures. FIG. 3A illustrates a semiconductor package 300 which corresponds to system 100 and/or processor 110. Semiconductor package 300 includes a host die 330 which corresponds to host die 130 and/or host die 230, a chiplet area 332 which corresponds to chiplet area 232, a chiplet area 334 which corresponds to chiplet area 234, an interface 362 which corresponds to interface 162 and/or interface 262, and an interconnect 352 which corresponds to interconnect 152. Interconnect 352 allows direct communication between connected chiplets. For example, in FIG. 3A, interconnect 352 directly couples chiplet area 332 to chiplet area 334 to allow direct inter-chiplet communication between a first chiplet in chiplet area 332 and a second chiplet in chiplet area 334, as indicated by the arrow.

In addition, interconnect 352 allows the first and second chiplets to communicate with each other using a different communication protocol than the standard communication protocol used with host die 330. Although the first and second chiplets can directly communicate using the standard communication protocol, a custom communication protocol can reduce latency. For example, the first and second chiplets can communicate data, addresses, and/or other signals directly without having to first convert to the standard communication protocol. The first and second chiplets can use a communication protocol running at a different clock speed than that of the standard communication protocol. The first and second chiplets can customize how interconnect 352 is used, as described further below.

Figure 4:
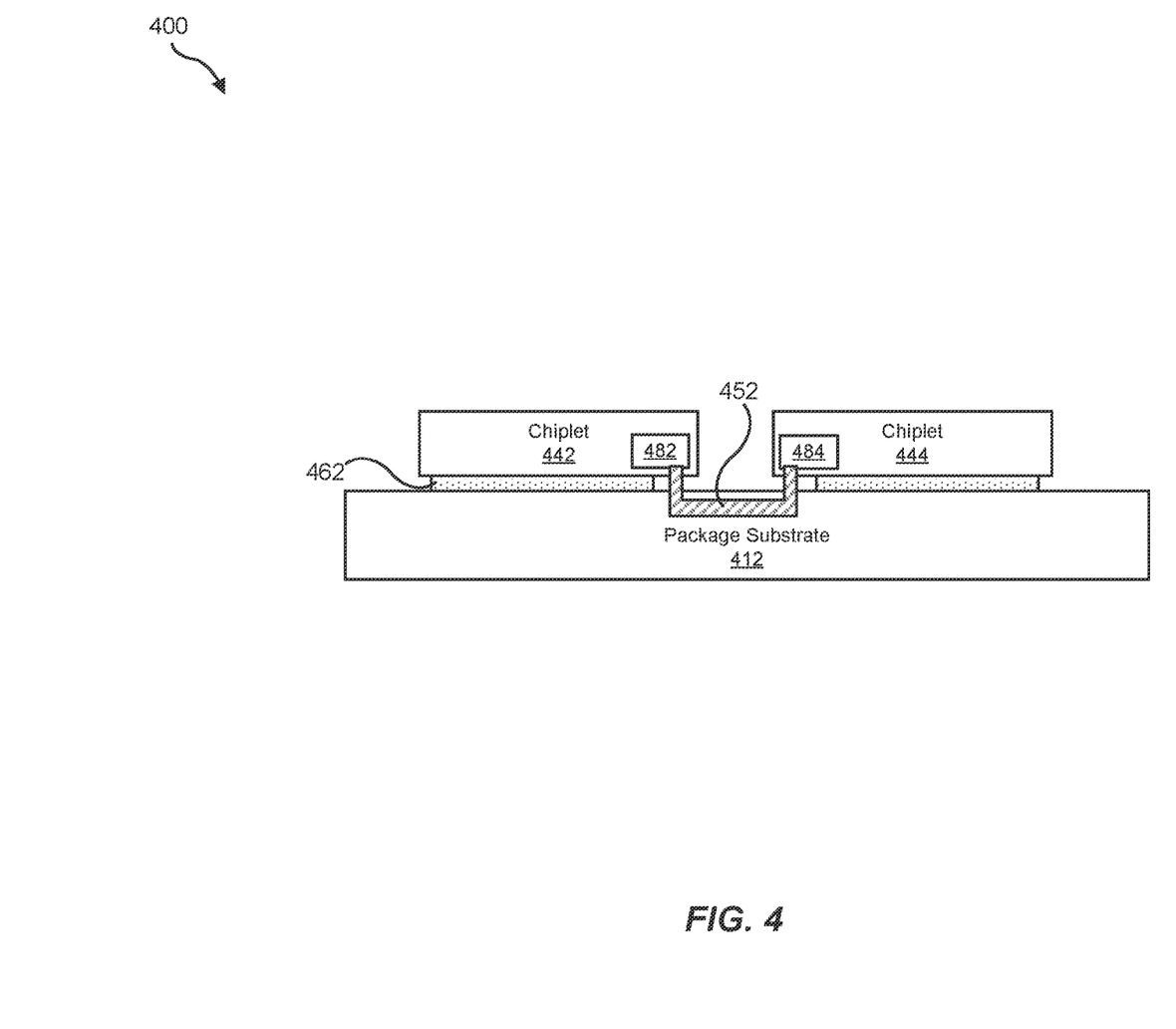
FIG. 4 is a simplified side view of a backside interface for chiplet architecture mixing.

FIG. 4 illustrates a side view of a semiconductor package 400 corresponding to semiconductor package 300. Semiconductor package 400 includes a package substrate 412, a chiplet 442 which corresponds to chiplet 142, a chiplet 444 which corresponds to chiplet 144, an interface 462 which corresponds to interface 162, interface 262, and/or interface 362, and an interconnect 452 which corresponds to interconnect 152 and/or interconnect 352. As shown in FIG. 4, interconnect 452 is a backside interconnect or backside link, e.g. prepared as one or more pre-populated metal routes/ wires in package substrate 412. In some examples, interconnect 452 includes multiple metal routes between chiplet 442 and chiplet 444.

Chiplet 442 includes a control circuit 482 and chiplet 444 includes a control circuit 484. Control circuit 482 and control circuit 484 allow chiplet 442 and chiplet 444, respectively, to customize how to use interconnect 452, such as establishing a custom communication protocol between chiplet 442 and chiplet 444. For example, one of the metal routes in interconnect 452 can be used for sending data signals, another route can be used for sending address signals, etc. Control circuit 482 and/or control circuit 484 can establish a clock speed for sending/receiving signals. In some examples, control circuit 482 and control circuit 484 may work in conjunction to utilize interconnect 452.

In some examples, control circuit 482 and/or control circuit 44 can disable one or more of the routes. For example, control circuit 482 can include a ground connection and control circuit 484 can include a switch to disable one or more routes. In some examples, control circuit 482 and/or control circuit 484 can disable all routes of interconnect 452 to effectively disable interconnect 452. For example, if chiplet 442 does not require direct coupling to chiplet 444, interconnect 452 can be disabled.

In yet other examples, chiplet 442 and/or chiplet 444 can include additional control circuits for controlling additional interconnects. For example, as will be discussed further herein, chiplet 442 may be directly coupled to multiple chiplets via interconnects. Based on the chiplet architecture (e.g., which chiplets intercommunicate), the control circuits can enable/disable the corresponding interconnects as needed.

Figure 3B:
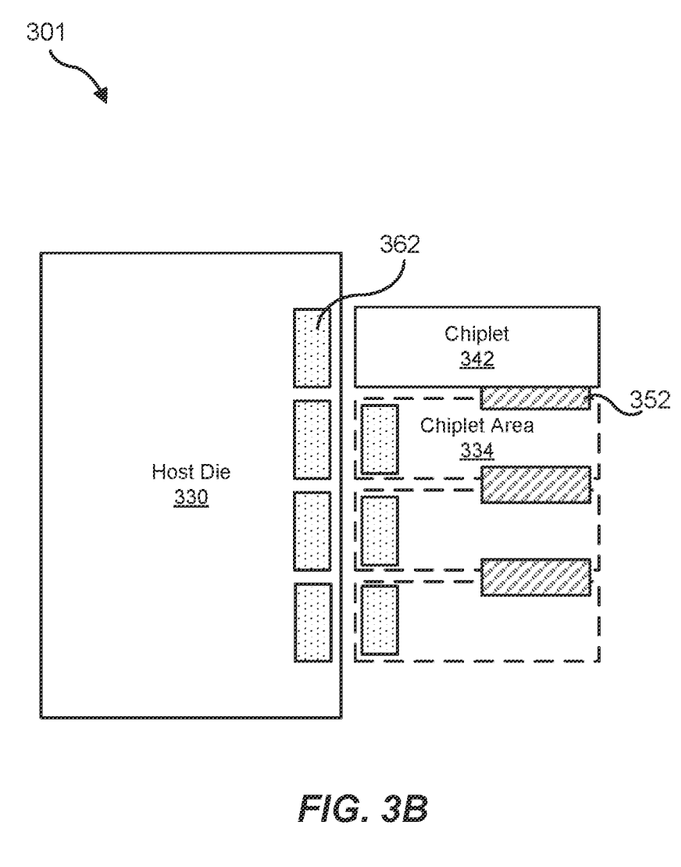

Turning now to FIG. 3B, FIGS. 3B-3J illustrates various example alternative layouts of semiconductor package 300. FIG. 3B illustrates a semiconductor package 301 which corresponds to system 100, processor 110, and/or semiconductor package 300. In FIG. 3B, a chiplet 342 (which corresponds to chiplet 142) is mounted to chiplet area 332. Thus, chiplet 342 is connected to both interface 362 and interconnect 352. Interconnect 352 does not modify or otherwise change interface 362 such that chiplet 342 can communicate with host die 330 (e.g., via the standard communication protocol).

Figure 3C:
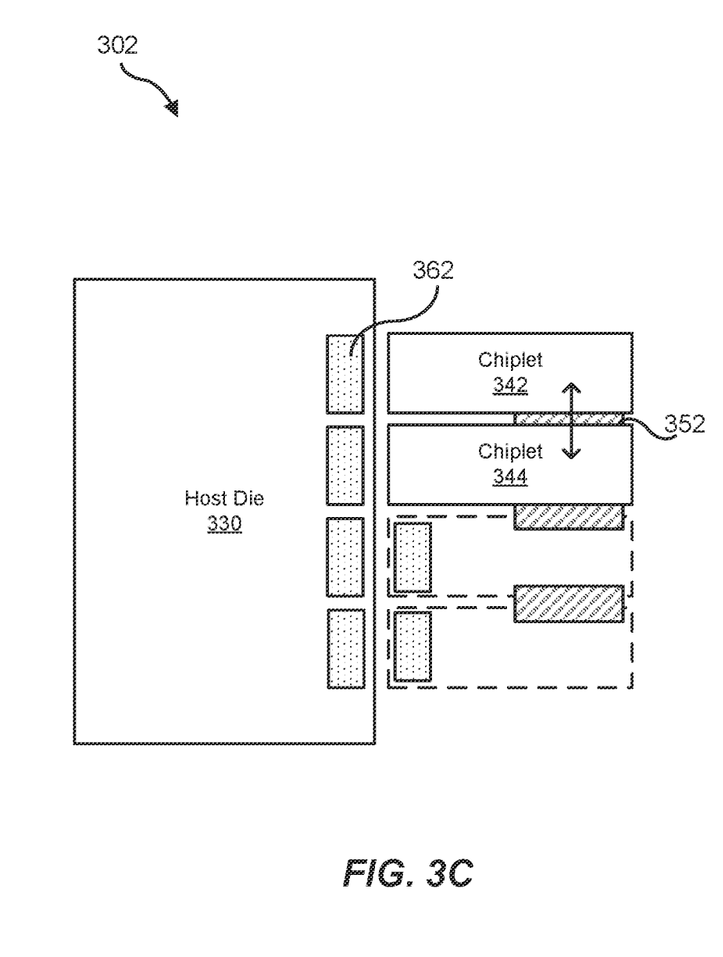

FIG. 3C illustrates a semiconductor package 302 which corresponds to system 100, processor 110, and/or semiconductor package 300. FIG. 3C illustrates interconnect 352 between adjacent chiplets. In FIG. 3C, a chiplet 344 (which corresponds to chiplet 144) is mounted to chiplet area 334. Chiplet 342 directly communicates with chiplet 344 via interconnect 352 (e.g., via a custom communication protocol), as indicated by the arrow. In addition, chiplet 342 and chiplet 344 can each communicate with host die 330 (e.g., via the standard communication protocol) as needed.

Figure 3D:
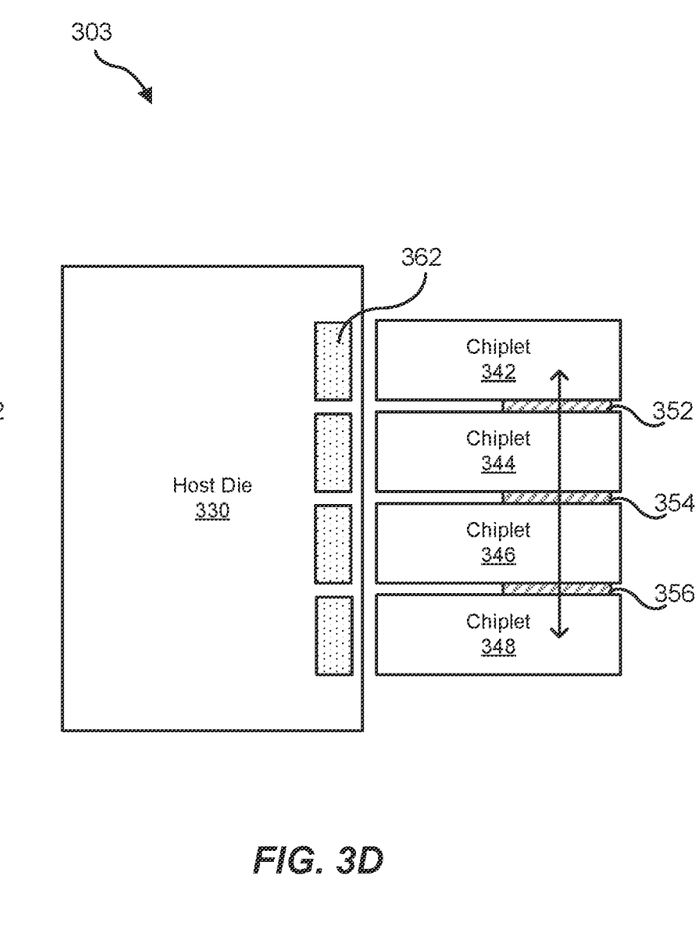

FIG. 3D illustrates a semiconductor package 303 which corresponds to system 100, processor 110, and/or semiconductor package 300. FIG. 3D illustrates interconnects between multiple adjacent chiplets. In FIG. 3D, a chiplet 346 and a chiplet 348 are also mounted. An interconnect 354 directly couples chiplet 344 and chiplet 346. An interconnect 356 directly couples chiplet 346 and chiplet 348. Chiplet 342, chiplet 344, chiplet 346, and chiplet 348 can directly communicate with each other via interconnect 352, interconnect 354, and interconnect 356 (e.g., via a custom communication protocol), as indicated by the arrow. In addition, chiplet 342, chiplet 344, chiplet 346, and chiplet 348 can each communicate with host die 330 (e.g., via the standard communication protocol) as needed. Moreover, in some examples chiplet 342, chiplet 344, chiplet 346, and chiplet 348 can all communicate using the same communication protocol or may use different communication protocols (e.g., between adjacent chiplets).

Figure 3E:
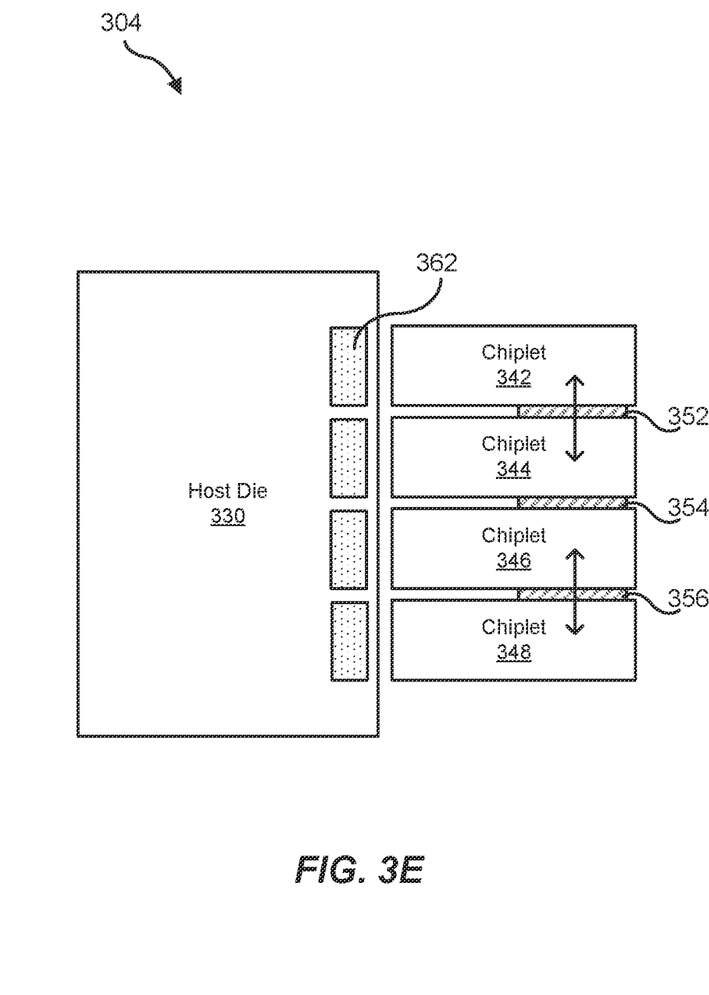

FIG. 3E illustrates a semiconductor package 304 which corresponds to system 100, processor 110, and/or semiconductor package 300. FIG. 3E illustrates how chiplet communication can be customized by disabling interconnects for example to establish distinct chiplet groupings (e.g., pairs). In FIG. 3E, interconnect 354 is disabled such that chiplet 342 and chiplet 344 can directly communicate with each other and chiplet 346 and chiplet 348 can directly communicate with each other, as indicated by the respective arrows. In some examples, chiplet 342 and chiplet 344 communicate using a different communication protocol than that of chiplet 346 and chiplet 348. In some examples, unlike in FIG. 3D, the chiplet pairs can not directly communicate, although the pairs can communicate via host die 330 as needed. Alternatively, interconnect 354 is enabled to allow the pairs to communicated (e.g., via a third communication protocol).

Figure 3F:
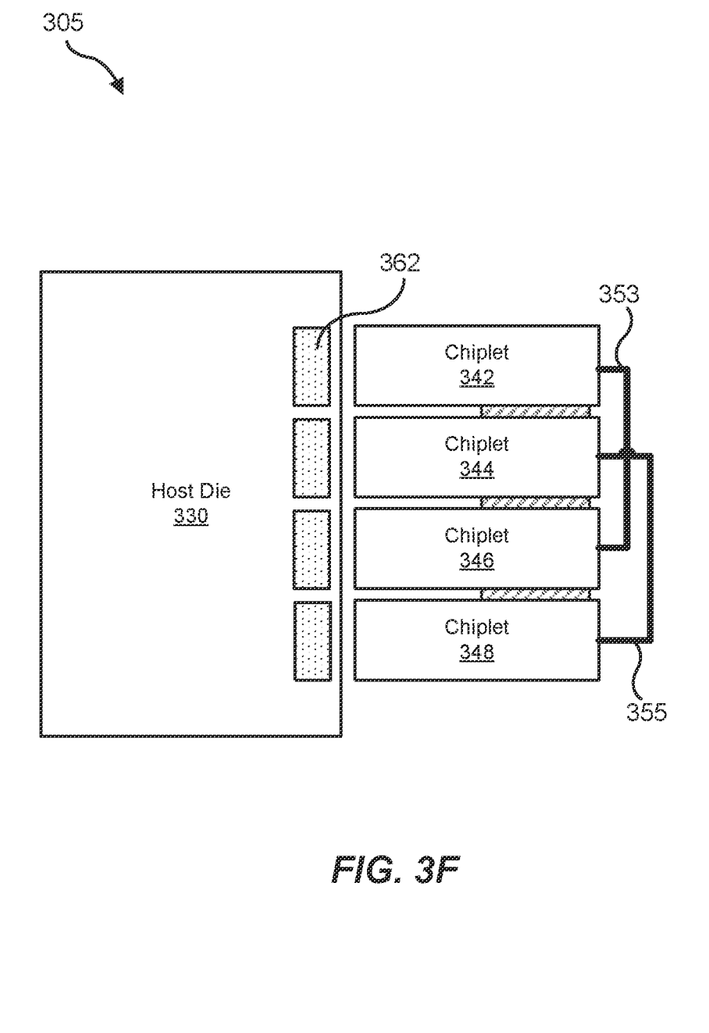

FIG. 3F illustrates a semiconductor package 305 which corresponds to system 100, processor 110, and/or semiconductor package 300. FIG. 3F illustrates interconnects between non-adjacent chiplets. For example, an interconnect 353 directly couples chiplet 342 and chiplet 346 and an interconnect 355 directly couples chiplet 344 and chiplet 348. The other interconnects can be enabled/disabled as needed.

Figure 3G:
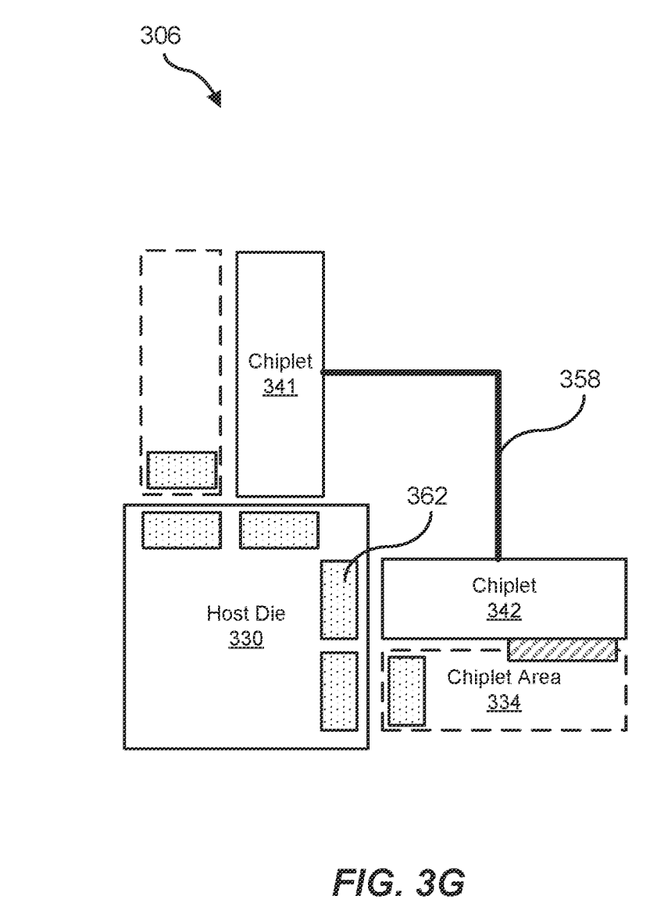

FIG. 3G illustrates a semiconductor package 306 which corresponds to system 100, processor 110, and/or semiconductor package 300. FIG. 3G illustrates another example of directly coupling non-adjacent chiplets. For example, a chiplet 341 is positioned on a neighboring side of host die 330 as that of chiplet 342. An interconnect 358 directly couples chiplet 342 and chiplet 344 and other interconnects can be enabled/disabled as needed. In addition, FIG. 3G illustrates an example route for interconnect 358. In other examples, interconnect 358 can be arranged differently, for example under host die 330.

Figure 3H:
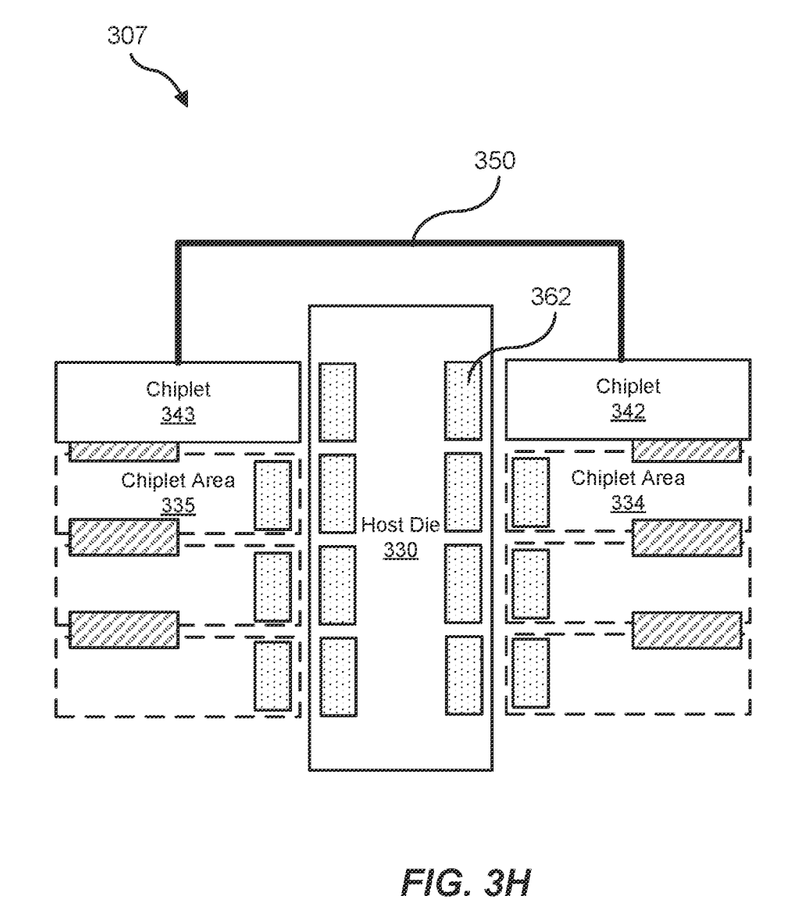

FIG. 3H illustrates a semiconductor package 307 which corresponds to system 100, processor 110, and/or semiconductor package 300. FIG. 3H illustrates yet another example of directly coupling non-adjacent chiplets. For example, a chiplet 343 is positioned on an opposite side of host die 330 than that of chiplet 342, which further includes at least a chiplet area 335. An interconnect 350 directly couples chiplet 342 and chiplet 343 and other interconnects can be enabled/disabled as needed. In addition, FIG. 3H illustrates an example route for interconnect 350. In other examples, interconnect 350 can be arranged differently, for example under host die 330.

Figure 3I:
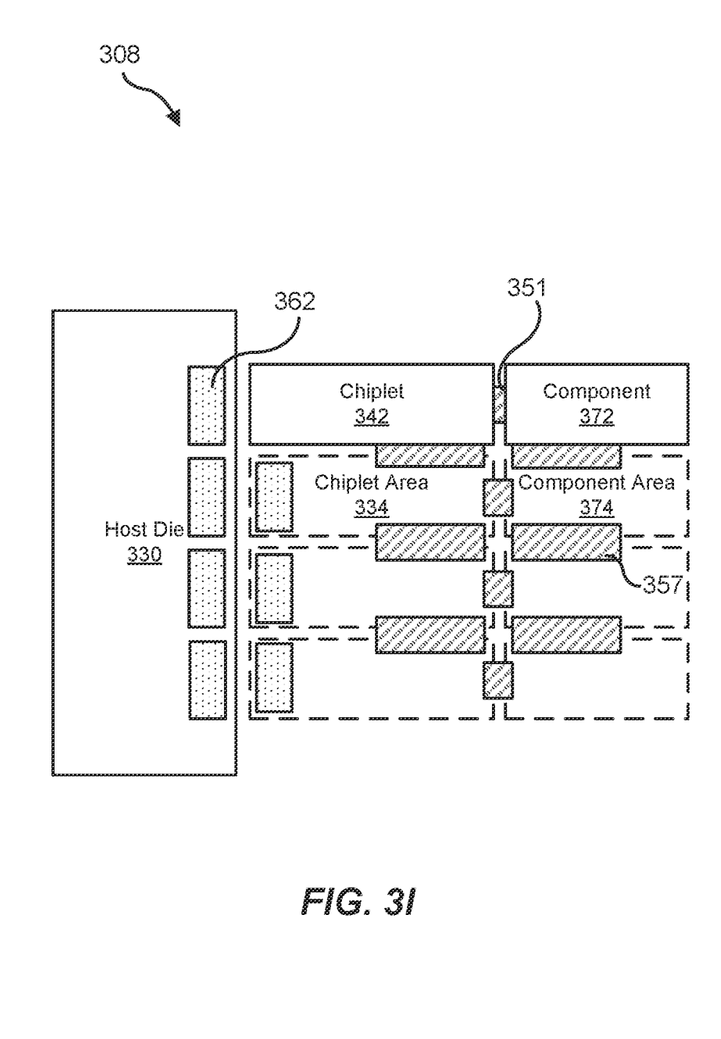

FIG. 3I illustrates a semiconductor package 308 which corresponds to system 100, processor 110, and/or semiconductor package 300. FIG. 3I illustrates how additional components can be coupled via interconnects. A component area 374 can be adjacent to chiplet area 334 and in some examples, as illustrated in FIG. 3I, have a reversed arrangement as chiplet area 334 with respect to interconnects (e.g., an interconnect 357). Component area 374 is a component area or landing site for a component. A component 372 is mounted onto a corresponding component area adjacent to chiplet 342. Component 372 corresponds to a component such as a chiplet or in some examples a passive device that is not coupled to host die 330. An interconnect 351 directly couples chiplet 342 and component 372 and other interconnects can be enabled/disabled as needed.

Figure 3J:
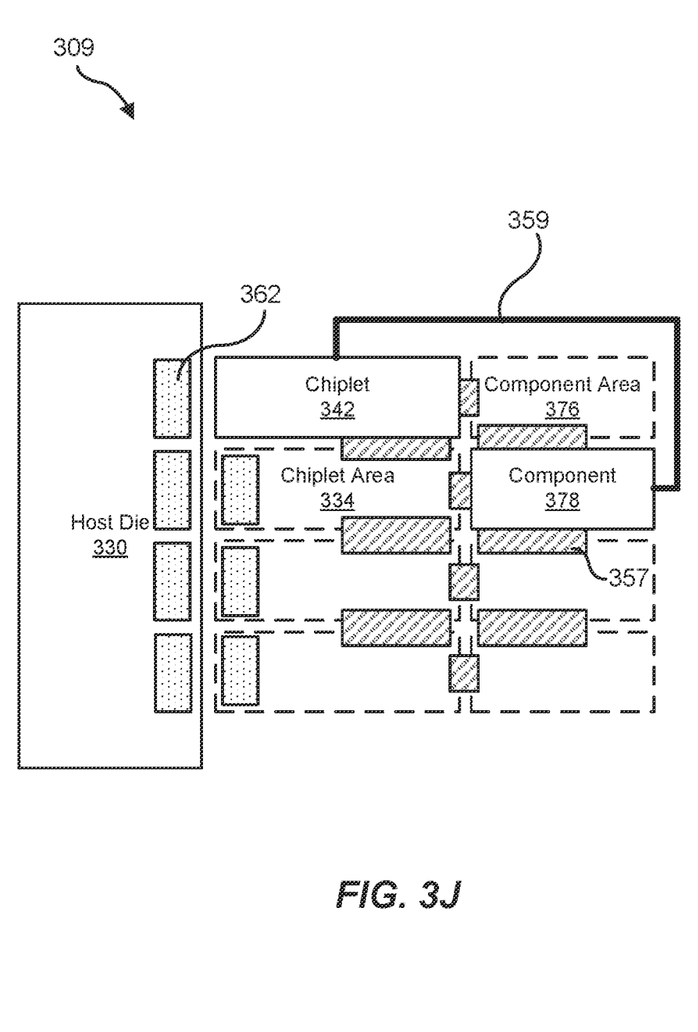

FIG. 3J illustrates a semiconductor package 309 which corresponds to system 100, processor 110, and/or semiconductor package 300. FIG. 3J illustrates how non-adjacent components can be coupled via interconnects. A component area 376 can be adjacent to chiplet 342 whereas a component 378 is mounted adjacent to chiplet area 334. Component 378 corresponds to a component such as a chiplet or in some examples a passive device that is not coupled to host die 330. An interconnect 359 directly couples chiplet 342 and component 378 and other interconnects can be enabled/disabled as needed. In addition, FIG. 3J illustrates an example route for interconnect 359. In other examples, interconnect 359 can be arranged differently, for example under chiplets and/or components.

As described herein, the systems and methods provided in the present disclosure are directed to chiplet architecture mixing via interconnects. Current chiplet interface efforts include standardizing the definition of how chiplets communicate with each other. A common topology includes a host die (e.g., IOD) having separate connections to each of the chiplets. However, multiple chiplets (particularly from 3rd-parties) can have additional point-to-point communication needs among themselves that do not require support from the host die and/or could be more efficient if an interface other than the standardized interface were utilized. The present disclosure provides for multi-chiplet accelerators and generalized packaging support that can support the assembly of both cooperative and independently operating chiplets.

Different products need different levels of accelerator compute capabilities, which could be provided by chiplets. However, achieving the different levels require building multiple chiplet types (e.g., low, medium, and high levels of accelerator performance) further requiring higher design costs, or designing a single "lowest common denominator" chiplet and varying how many of such chiplets are deployed in a given system. However, for this multi-chiplet accelerator approach, the host-centric chiplet interconnect model funnels all inter-chiplet communication through the host die, creating a bottleneck with the host die.

In an example of varying the number of chiplets to effectively achieve different levels of performance or acceleration, different numbers of 3rd-party accelerator chiplets can deliver different levels of performance with the same overall processor package. When there is more than one chiplet, the interconnects described herein enable the chiplets to communicate directly to each other without passing data back through the host die. For example, the interconnects enable passing data between machine learning accelerators during the all-reduce phase of neural network training. Although in some implementations the chiplets are identical, other implementations can use a mix of different chiplets that do not need to be identical.

In examples of a chiplet that does not use an interconnect, the chiplet can set the interconnect connections to ground or disconnected/high-impedance (high-Z). In some examples, a degree of coordination between neighboring chiplets can prevent the interconnect electrical traces from floating. For example, one chiplet can connect its end of the interconnect routes to ground while the other chiplet sets its interconnect outputs to high-Z (e.g., disabled tri-state buffer).

The processor package provides the electrical connections, but in some examples does not specify any particular protocol or signaling that is to be used across the interconnect interface. Multiple chiplets can choose to use whatever is appropriate for their use cases. For example, some chiplets can use a standardized protocol while others can use a proprietary protocol. Within the same package, different sets of chiplets can utilize different protocols.

In some examples, the interconnects can connect adjacent chiplet landing sites (see, e.g., FIGS. 3A-3E). In other examples, the interconnects can connect non-adjacent landing sites (see, e.g., FIGS. 3F-3H) with potential tradeoffs in bandwidth/power/etc. For instance, the longer interconnects can exhibit more capacitance/impedance for the transmitters/receivers to deal with on either side of the link, potentially leading to more challenging signal integrity and/or lower data rates.

In some examples, the chiplets are not restricted to a single "column" of landing sites (as in FIG. 3A). For example, FIG. 3I illustrates two columns of chiplet landing sites, with interconnects going between both rows and columns. In this example, the right-hand side components are rotated 180 degrees so that all of the interconnect interfaces line up. If a die-to-die interface (e.g. on the right-hand side and not shown in FIG. 3I) is unused, they can be powered off and/or disconnected. Other implementations can be extended to more columns and/or more rows.

Although the interconnects can couple identical chiplets, the interconnects can also be applied to a heterogeneous mix of chiplets that benefit from direct point-to-point interfaces without having to route traffic back through the host die. For example (e.g., FIG. 3I), rather than disabling the unused D2D interface on the right-hand side, another approach (albeit possibly more expensive) includes using a different chiplet design in the right column that did not implement the D2D interface (thus potentially freeing up more silicon area for compute or other functions).

While the descriptions above are presented in the context of a processor package (e.g., organic substrate), the systems and methods described herein can be applied to other technologies for integrating multiple chiplets including silicon interposers, silicon bridges, integrated fan-out (InFO), etc.

As detailed above, the computing devices and systems described and/or illustrated herein broadly represent any type or form of computing device or system capable of executing computer-readable instructions, such as those contained within the modules described herein. In their most basic configuration, these computing device(s) each include at least one memory device and at least one physical processor.

In some examples, the term "memory device" generally refers to any type or form of volatile or non-volatile storage device or medium capable of storing data and/or computer-readable instructions. In one example, a memory device stores, loads, and/or maintains one or more of the modules and/or circuits described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor accesses and/or modifies one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), systems on a chip (SoCs), digital signal processors (DSPs), Neural Network Engines (NNEs), accelerators, graphics processing units (GPUs), portions of one or more of the same, variations or combinations of one or more of the same, or any other suitable physical processor.

In some implementations, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein are shown or discussed in a particular order, these steps do not necessarily need to be performed in the order illustrated or discussed. The various exemplary methods described and/or illustrated herein can also omit one or more of the steps described or illustrated herein or include additional steps in addition to those disclosed.

The preceding description has been provided to enable others skilled in the art to best utilize various aspects of the exemplary implementations disclosed herein. This exemplary description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A semiconductor package comprising:
   a substrate;
   a first chiplet area for receiving a first chiplet on the substrate;
   a second chiplet area for receiving a second chiplet on the substrate;
   a host die on the substrate directly coupled to the first chiplet area via a first plurality of conductive routes, wherein the host die is configured to route off-chip communication for the first chiplet; and
   a backside interconnect comprising a second plurality of conductive routes that extend through the substrate and are separate from the first plurality of conductive routes, wherein the second plurality of conductive routes are directly coupled between the first chiplet area and the second chiplet area and configured to bypass the host die for direct inter-chiplet communication between the first chiplet and the second chiplet.

2. The semiconductor package of claim 1, further comprising the first chiplet in the first chiplet area and the second chiplet in the second chiplet area.

3. The semiconductor package of claim 2, wherein the first chiplet communicates with the host die using a first communication protocol and the first chiplet communicates with the second chiplet using a second communication protocol via the backside interconnect, wherein the second communication protocol defines a type of signal sent through each of the second plurality of conductive routes.

4. The semiconductor package of claim 3, wherein the first and second communication protocols run at different clock speeds.

5. The semiconductor package of claim 2, wherein the second chiplet comprises a circuit for selectively disabling one or more of the second plurality of conductive routes of the backside interconnect.

6. The semiconductor package of claim 5, wherein the circuit comprises a ground.

7. A device comprising:
   a substrate;
   a host die on the substrate;
   a plurality of chiplets on the substrate and positioned around the host die and a first chiplet of the plurality of chiplets being directly coupled to the host die via a first plurality of conductive routes, wherein the host die is configured to route inter-chiplet communication between one or more of the plurality of chiplets and off-chip communication for the first chiplet of the plurality of chiplets; and
   a backside interconnect comprising a second plurality of conductive routes that extend through the substrate and are separate from the first plurality of conductive routes, wherein the second plurality of conductive routes are directly coupled between the first chiplet of the plurality of chiplets and a second chiplet of the plurality of chiplets and configured to bypass the host die for direct inter-chiplet communication between the first chiplet and the second chiplet.

8. The device of claim 7, wherein the plurality of chiplets communicate with the host die using a first communication protocol and the first chiplet communicates with the second chiplet using a second communication protocol via the backside interconnect, wherein the second communication protocol defines a type of signal sent through each of the second plurality of conductive routes.

9. The device of claim 8, wherein the first and second communication protocols run at different clock speeds.

10. The device of claim 7, wherein the second chiplet comprises a circuit for selectively disabling one or more of the second plurality of conductive routes of the backside interconnect.

11. The device of claim 7, further comprising a passive device and a second interconnect directly coupling the passive device to one of the plurality of chiplets, wherein the passive device is not coupled to the host die.

12. The device of claim 7, wherein the first chiplet is adjacent to the second chiplet.

13. The device of claim 7, wherein the first chiplet is non-adjacent to the second chiplet.

14. A system comprising:
   a substrate;
   a host die on the substrate;
   a plurality of chiplets on the substrate and positioned around the host die and each directly coupled to the host die through a plurality of interconnect interfaces, wherein each of the plurality of chiplets communicate with the host die using a first communication protocol via the corresponding interconnect interface and the host die is configured to route inter-chiplet communication between the plurality of chiplets and off-chip communication for the plurality of chiplets; and a backside interconnect comprising a plurality of conductive routes that extend through the substrate and are separate from the plurality of interconnect interfaces, wherein the plurality of conductive routes are directly coupled between a first chiplet of the plurality of chiplets and a second chiplet of the plurality of chiplets and configured to bypass the host die for direct inter-chiplet communication between the first chiplet and the second chiplet, wherein the first chiplet directly communicates with the second chiplet using a second communication protocol via the backside interconnect, and the second communication protocol defines a type of signal sent through each of the plurality of conductive routes.

15. The system of claim 14, wherein the first and second communication protocols run at different clock speeds.

16. The system of claim 14, wherein the second chiplet comprises a circuit for selectively disabling one or more of the plurality of conductive routes of the backside interconnect.

17. The system of claim 16, wherein the circuit comprises a ground.

18. The system of claim 14, further comprising a passive device and a second interconnect directly coupling the passive device to one of the plurality of chiplets, wherein the passive device is not coupled to the host die.

19. The system of claim 14, wherein the first chiplet is adjacent to the second chiplet.

20. The system of claim 14, wherein the first chiplet is non-adjacent to the second chiplet.

* * * * *